(12) United States Patent
Barakat et al.

(10) Patent No.: US 9,529,059 B2
(45) Date of Patent: Dec. 27, 2016

(54) DUAL SQUID MEASUREMENT DEVICE

(71) Applicant: Gedex Systems Inc., Mississauga (CA)

(72) Inventors: Neil Barakat, Brampton (CA); Andrew Hugill, Toronto (CA); Ilia Tomski, Vaughan (CA); Hong Wong, Toronto (CA)

(73) Assignee: Gedex Systems Inc., Mississauga, Ontario (CA)

( * ) Notice: Subject to any disclaimer, the term of this patent is extended or adjusted under 35 U.S.C. 154(b) by 95 days.

(21) Appl. No.: 14/503,661

(22) Filed: Oct. 1, 2014

(65) Prior Publication Data

US 2016/0154068 A1      Jun. 2, 2016

Related U.S. Application Data

(60) Provisional application No. 61/885,054, filed on Oct. 1, 2013.

(51) Int. Cl.
  *G01R 33/035*      (2006.01)
  *G01R 33/00*       (2006.01)

(52) U.S. Cl.
  CPC ....... *G01R 33/0356* (2013.01); *G01R 33/0029* (2013.01); *G01R 33/035* (2013.01)

(58) Field of Classification Search
  CPC .................. G01R 33/0356; G01R 33/0029
  USPC ....................................................... 324/248
  See application file for complete search history.

(56) References Cited

U.S. PATENT DOCUMENTS

| | | |
|---|---|---|
| 7,323,869 B1 | 1/2008 | Penanen |
| 8,179,133 B1 | 5/2012 | Kornev et al. |
| 2002/0060635 A1 | 5/2002 | Gupto |
| 2008/0001599 A1 | 1/2008 | Wu et al. |
| 2009/0082209 A1* | 3/2009 | Bunyk ............... B82Y 10/00 505/190 |
| 2012/0077468 A1* | 3/2012 | Fan .................. G07C 9/00309 455/414.1 |

(Continued)

FOREIGN PATENT DOCUMENTS

EP      2476005      6/2013

OTHER PUBLICATIONS

Patent Cooporation Treaty, Notification of Transmittal of the International Search Report and the Written Opinion of the International Searching Authority, or the Declaration, date, Dec. 30, 2014.

*Primary Examiner* — Christopher Mahoney
(74) *Attorney, Agent, or Firm* — Bereskin & Parr LLP/S.E.N.C.R.L., s.r.l.

(57) ABSTRACT

An electronic measuring device is described that can include first and second input inductors connected in series. A shunt inductor is connected in parallel with the second input inductor. Optionally, an additional shunt inductor may also be used in parallel with the first input inductor. The first and second input inductors are inductively coupled to first and second SQUIDs which are in turn inductively coupled to first and second feedback inductors. First and second SQUID controllers are connected, respectively, to the first and second SQUIDs as well as the first and second feedback inductors. The first and second SQUID controllers are also connected to a processor. The processor is operable to process the output of the first and second SQUID controllers to detect unlocking events in the output of the first SQUID controller.

20 Claims, 4 Drawing Sheets

(56) References Cited

U.S. PATENT DOCUMENTS

2012/0157319 A1\* 6/2012 Tsukamoto ........ G01R 33/0354
                                                      505/162

\* cited by examiner

DUAL SQUID MEASUREMENT DEVICE

CROSS-REFERENCE TO RELATED APPLICATIONS

This application claims the benefit of U.S. Provisional Patent Application No. 61/885,054 filed on Oct. 1, 2013 entitled "DUAL SQUID MEASUREMENT DEVICE", which is incorporated by reference herein in its entirety.

FIELD

The disclosed embodiments relate to the field of measurements using superconducting quantum interference devices (SQUIDs) and, more particularly, to the field of detecting and removing unlocking events from SQUID controller output data using two SQUIDs in series.

BACKGROUND

A Superconducting Quantum Interference Device (SQUID) is a very sensitive magnetometer used to measure extremely small magnetic fields. SQUIDs function using two Josephson junctions connected in parallel in a superconducting loop. As used herein, SQUID refers to a DC-SQUID, and not to an RF-SQUID which uses a single Josephson junction.

An initial bias current, $I_B$, is introduced and splits evenly between both branches of the loop, which encloses a certain magnetic flux, $\phi$. FIG. 1 shows a SQUID 10 in its unperturbed state, when there is no external magnetic field, $I_1=I_2=0.5*I_B$. An externally imposed magnetic flux, the quantity SQUIDs are used to measure, can change the value of the enclosed flux and consequently induce a current in the loop. The induced current flows around the loop and adds to the bias current in one branch but subtracts from it in the other branch. When the induced current exceeds a critical value, a voltage, V, appears across the SQUID.

A typical plot of the voltage across a SQUID responding to changes in the enclosed magnetic flux is shown in FIG. 2. The measured voltage will vary sinusoidally with the magnetic flux with a period proportional to the magnetic flux quantum, $\phi_0$. Of note is the fact that any particular voltage measured across the SQUID may correspond to any one of a theoretically infinite number of possible values of the magnetic flux.

FIG. 3 shows SQUID 10 configured as a measurement instrument. In this configuration, the external magnetic field is imposed by an input current, $I_{in}$, passing through an inductor, $L_1$, near SQUID 10. SQUID controller 20 supplies the bias current, $I_B$, and measures the voltage across SQUID 10. As the input current changes, the magnetic flux through SQUID 10 changes and the voltage measured by SQUID controller 20 changes in the manner illustrated in FIG. 2. There are a potentially infinite number of possible values of the magnetic flux for any one measured value of the voltage across SQUID 10.

To achieve an approximately linear measurement of the magnetic flux passing through the loop a re-balancing control system is used where a feedback controller measures the voltage across the SQUID and adjusts the feedback current flowing through feedback inductor $L_{1F}$ in order to counteract the changes in flux imposed on SQUID 10 by input inductor $L_1$ and keep the measured voltage constant. The value of the voltage to be maintained is chosen to be the average value of the sinusoid so that small variations are approximately linear with respect to magnetic flux.

However, SQUID controller 20 is limited in its ability to detect a voltage change and adjust the feedback current to compensate. High frequency or high amplitude changes in the input current, causing a high slew rate in the measured voltage across SQUID 10, can overwhelm the ability of SQUID controller 20 to adjust the compensating feedback current quickly enough. This results in SQUID controller 20 "unlocking" and settling into a different value of the magnetic flux for the same measured voltage than before the unlocking event took place.

SUMMARY

The embodiments described herein provide in one aspect, an electronic measurement device comprising first and second input inductors connected in series and connectable in series with a current input source. The electronic measurement device further comprises a first superconducting quantum interference device (SQUID) inductively coupled to the first input inductor; a first feedback inductor inductively coupled to the first SQUID and a first SQUID controller connected to the first SQUID and the first feedback inductor for controlling the current in the first feedback inductor. The electronic measurement device further comprises a second SQUID inductively coupled to the second input inductor, a shunt inductor connected parallel to the second input inductor, a second feedback inductor inductively coupled to the second SQUID, and a second SQUID controller connected to the second SQUID and the second feedback inductor for controlling the current in the second feedback inductor. The electronic measurement device further comprises a processor connected to the first and second SQUID controllers for processing the output of the first and second SQUID controllers to detect unlocking events in the output of the first SQUID controller In some embodiments, the inductance of the shunt inductor is chosen to be less than the inductance of the second input inductor. The inductance of the shunt inductor may 10% or less of the inductance of the second input inductor. In some embodiments, the inductance of the shunt inductor may be approximately 1% of the inductance of the second input inductor.

In some embodiments, the inductance of the first input inductor may be substantially equal to the inductance of the second input inductor.

In some embodiments, the electronic measuring device further comprises an additional shunt inductor connected in parallel to the first input inductor. The additional shunt inductor may have an inductance that is less than the inductance of the first input inductor but greater than the inductance of the shunt inductor. The inductance of the additional shunt inductor may be approximately 10% of the inductance of the first input inductor.

In some embodiments, the processor uses any one of scaling and subtracting, wavelet analysis and regression analysis to detect unlocking events in the output of the first SQUID controller.

In some embodiments, the processor removes the detected unlocking events from the output of the first SQUID controller.

Further aspects and advantages of the embodiments described herein will appear from the following description taken together with the accompanying drawings.

BRIEF DESCRIPTION OF THE DRAWINGS

For a better understanding of the described example embodiments and to show more clearly how they may be carried into effect, reference will now be made, by way of example, to the accompanying drawings in which.

DETAILED DESCRIPTION OF VARIOUS EMBODIMENTS

The exemplary embodiment described herein is a circuit and data processing technique whereby SQUID unlocking events can be detected and removed from SQUID controller output data. Numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments generally described herein.

Furthermore, this description is not to be considered as limiting the scope of the embodiments described herein in any way, but rather as merely describing the implementation of various embodiments as described.

Figure 1:
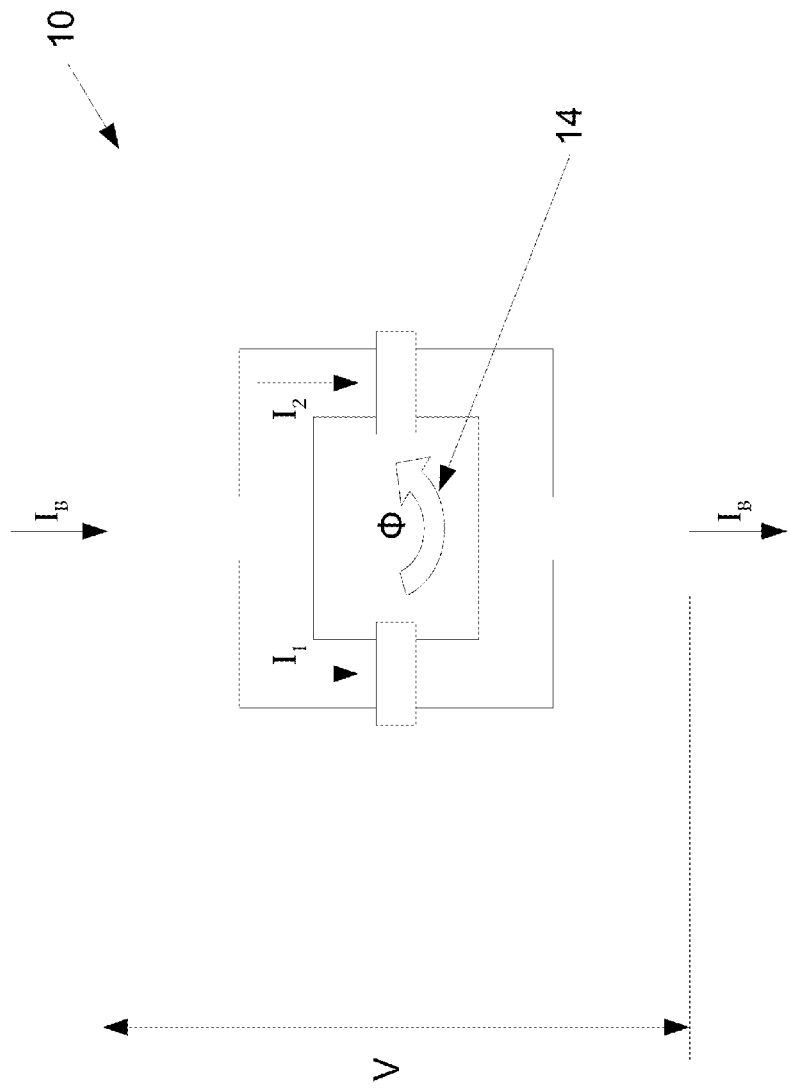
FIG. 1 shows a SQUID under no external magnetic field.
Figure 2:
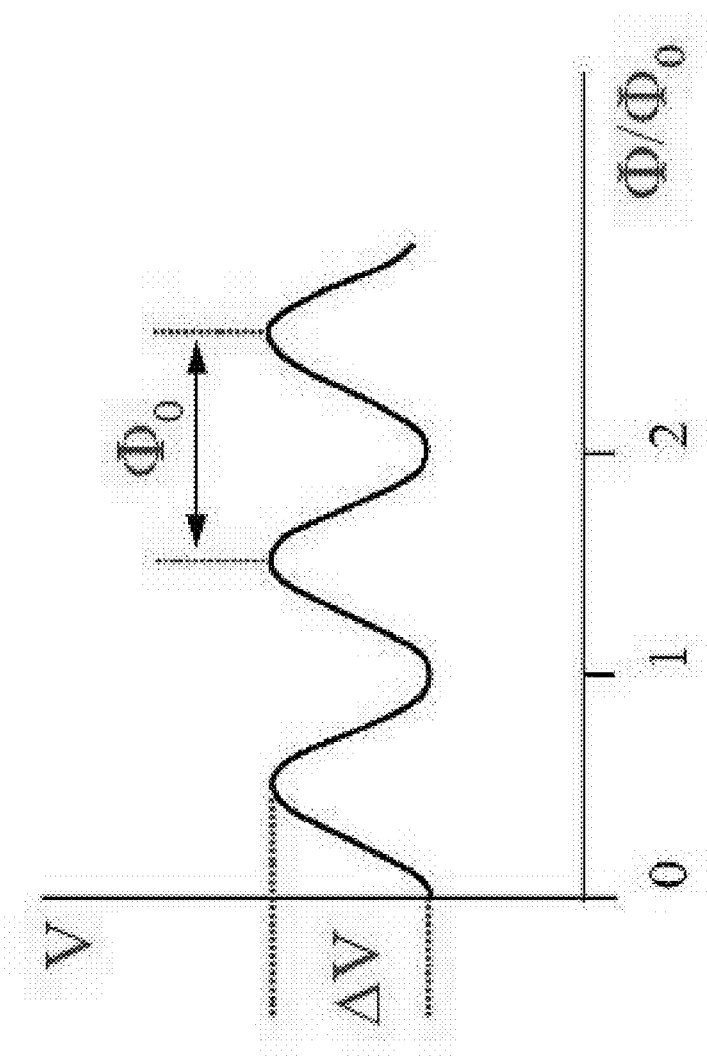
FIG. 2 shows plot of the voltage across a SQUID responding to changes in the enclosed magnetic flux.
Figure 3:
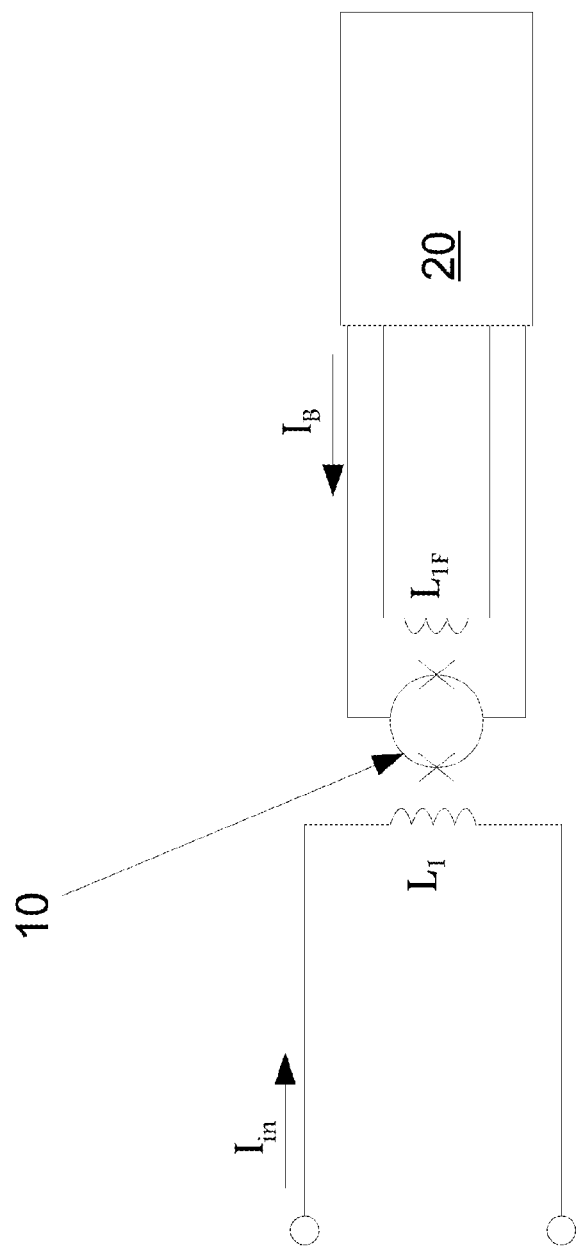
FIG. 3 shows a SQUID configured as a re-balancing measuring device.
Figure 4:
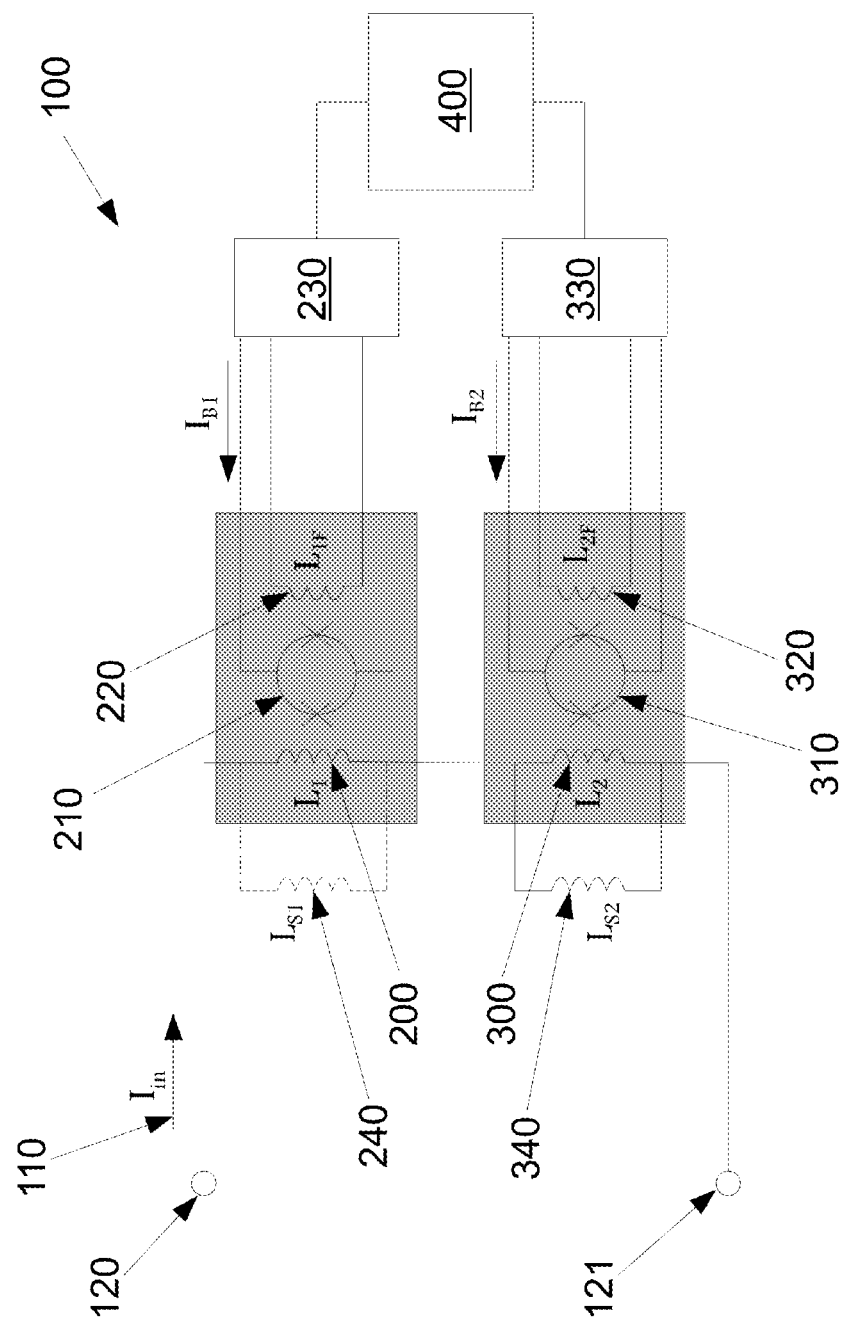
FIG. 4 shows one embodiment of a dual SQUID measurement device.

FIG. 4 shows one embodiment of a dual SQUID measurement device 100. A source of input current 110 to be measured is connected between terminals 120 and 121. Input current 110 runs, in series, through first and second input inductors 200, 300, having inductances $L_1$ and $L_2$, respectively. First and second input inductors 200, 300 are inductively coupled to first and second SQUIDs 210, 310 which are, in turn, inductively coupled to first and second feedback inductors 220, 320 having inductances $L_{1F}$ and $L_{2F}$. First and second SQUID controllers 230, 330 are connected, respectively, to first and second SQUIDs 210, 310 as well as first and second feedback inductors 220, 320. First and second SQUID controllers 230, 330 are also connected to processor 400. In addition, shunt inductor 340, having inductance $L_{S2}$, is connected in parallel with second input inductor 300. Optional shunt inductor 240 may also be used in parallel with first input inductor 200.

The inductance of shunt inductor 340 is chosen to be less than the inductance of second input inductor 300 ($L_{S2} < L_2$) so that the bulk of the input current will flow through shunt inductor 340. For example, the inductance of shunt inductor 340 may be 10% or less of the inductance of second input inductor 300. If optional shunt inductor 240 is used, the inductance of optional shunt inductor 240, $L_{S1}$, is chosen such that the current that would flow through first input inductor 200 is greater than the current that would flow through second input inductor 300 when the device is operating.

Processor 400 can be any hardware configuration able to apply any suitable signal processing technique. Processor 400 can be implemented in either analog or, preferably, digital domains. Further, processor 400 can be implemented in real-time or can store data for processing later. Accordingly, processor 400 may comprise data transmission and storage functions and need not necessarily be implemented on a single piece of hardware or in a single location. Those of skill in the art will be able to choose a suitable processor 400 for their particular implementation of the invention.

In operation a single input current 110 passes through both of the first and second input inductors 200, 300 in series, attenuated by shunt inductor 340 connected in parallel to second input inductor 300 and possibly by optional shunt inductor 240 connected in parallel to the first input inductor 200. First and second input inductors 200, 300 cause the magnetic flux experienced by first and second SQUIDs 210, 310 to vary with changes in input current 110. First and second SQUID controllers 230, 330 supply bias currents to, and measure the voltage changes across, first and second SQUIDs 210, 310 as well as attempt to counteract the measured changes by varying the current passing through first and second feedback inductors 220, 320. Output from first and second SQUID controllers 230, 330 is sent to processor 400 for processing.

Preferably, first SQUID 210 is inductively coupled to a larger fraction of input current 110 than second SQUID 310. As a result of this configuration, first SQUID 210 will be more sensitive to variations in input current 110 than second SQUID 310, but second SQUID controller 330 will have a lower probability of unlocking than first SQUID controller 230. Specifically, the magnetic flux variations experienced by first and second SQUIDs 210, 310 will be similar, with a few exceptions. First, the amplitude of the variations in flux experienced by first SQUID 210 will be greater than the amplitude of the variations experienced by second SQUID 310. Accordingly, first SQUID controller 230 will be subjected to larger slew rates than those experienced by second SQUID controller 330. Second, as a result of the higher slew rates, first SQUID controller 230 will unlock more often than second SQUID controller 330 causing instances where first SQUID controller 230 unlocks but second SQUID controller 330 does not unlock. In certain embodiments, the inductances of first and second input inductor 200, 300, shunt inductor 340 and optional shunt inductor 240 may be chosen such that second SQUID controller 330 may experience no unlocking at all during data collection.

As a result, the output of SQUID controllers 230, 330 will also be similar with a few exceptions. First, the amplitude of the output signal of first SQUID controller 230 will be larger than the amplitude of the output signal of second SQUID controller 330. Second, the output signal of first SQUID controller 230 will have sudden discontinuities (steps), caused by unlocking events, that the output signal of second SQUID controller 330 does not have. These differences between the output signals of first and second SQUID controllers 230, 330 allows processor 400 to use the output signal received from second SQUID controller 330 to detect and remove unlocking events from the output signal received from first SQUID controller 230.

There are several techniques that processor 400 may use to detect and remove the unlocking events from output signal data received from first SQUID controller 230; those with skill in the art of signal processing will understand how to properly choose a method of step detection that is appropriate for their particular hardware and software configuration. As mentioned above, processing may occur in real-time or at any time thereafter, depending on the particular hardware and software involved and the method of step detection chosen. Examples of suitable techniques that allow determination of the location and magnitude of any steps in the data include, but are not limited to: scale and subtract, wavelet analysis and regression analysis.

Choosing the most suitable hardware components may require some trial and error, but the inventors have found that the following guidelines will aid the selection of the most suitable implementation of the exemplary embodiment described herein.

First, most components in both branches of the device should be chosen to be as similar as possible. SQUIDs are generally manufactured and sold as a unit containing the SQUID itself as well as the input inductor and the feedback inductor, as illustrated by the shaded areas in FIG. 4. Using the same model SQUID and SQUID controller in both branches will help to keep their noise characteristics as similar as possible.

Second, the inductance of first and second input inductors 200, 300 should match as closely as possible. This can generally be achieved by using the same model of manufactured SQUID in both branches, but possible variations in manufactured devices should be considered and checked. Subsequent guidelines will assume that the inductances of first and second input inductors 200, 300 match closely.

Third, the system is designed so that first SQUID 210 is more sensitive to variations in magnetic flux than second SQUID 310. As such, the inductance of optional shunt inductor 240, if used, must not be chosen to be too small or the sensitivity of first SQUID 210 can be compromised. An inductance of not less than 10% of the value of the inductance of first and second input inductors 200, 300 has been found to be effective. The system is also designed so that second SQUID controller 330 unlocks less than first SQUID controller 230. As such, the inductance of shunt inductor 340 should be chosen to be less than the inductance of first and second input inductors 200, 300 as well as less than the inductance of optional shunt inductor 240, if used. An inductance of approximately 1% of the inductance of first and second input inductors 200, 300 has been found to be effective.

Accordingly, one suitable way to balance the inductances of first and second input inductors 200, 300, respectively $L_1$ and $L_2$, with the inductances of shunt inductor 340, $L_{S2}$, and optional shunt inductor 240, $L_{S1}$, is: $L_1=L_2=10*L_{S1}=100*L_{S2}$. Those of skill in the art will understand additional acceptable ways to balance the system.

A number of embodiments have been described herein. However, it will be understood by persons skilled in the art that other variants and modifications may be made without departing from the scope of the embodiments as defined in the claims appended hereto.

The invention claimed is:

1. An electronic measurement device comprising:
  a) first and second input inductors connected in series and connectable in series with a current input source;
  b) a first superconducting quantum interference device (SQUID) inductively coupled to the first input inductor;
  c) a first feedback inductor, inductively coupled to the first SQUID;
  d) a first SQUID controller connected to the first SQUID and the first feedback inductor for controlling the current in the first feedback inductor;
  e) a second SQUID inductively coupled to the second input inductor;
  f) a shunt inductor connected parallel to the second input inductor;
  g) a second feedback inductor, inductively coupled to the second SQUID;
  h) a second SQUID controller connected to the second SQUID and the second feedback inductor for controlling the current in the second feedback inductor; and
  i) a processor connected to the first SQUID controller and the second SQUID controller for processing a first output of the first SQUID controller and a second output of the second SQUID controller to detect unlocking events in the first output of the first SQUID controller.

2. The electronic measuring device of claim 1 wherein the inductance of the shunt inductor is less than the inductance of the second input inductor.

3. The electronic measuring device of claim 2 wherein the inductance of the shunt inductor is 10% or less of the inductance of the second input inductor.

4. The electronic measuring device of claim 3 wherein the inductance of the shunt inductor is approximately 1% of the inductance of the second input inductor.

5. The electronic measuring device of claim 1 wherein the inductance of the first input inductor is substantially equal to the inductance of the second input inductor.

6. The electronic measuring device of claim 1 further comprising an additional shunt inductor connected in parallel to the first input inductor.

7. The electronic measuring device of claim 6 wherein the inductance of the additional shunt inductor is less than the inductance of the first input inductor and greater than the inductance of the shunt inductor.

8. The electronic measuring device of claim 7 wherein the inductance of the additional shunt inductor is approximately 10% of the inductance of the first input inductor.

9. The electronic measuring device of claim 1 wherein the processor uses any one of scaling and subtracting, wavelet analysis and regression analysis to detect unlocking events in the first output of the first SQUID controller.

10. The electronic measuring device of claim 1 wherein the processor also removes the detected unlocking events from the first output of the first SQUID controller.

11. A method for detecting unlocking events, the method comprising:
  a) connecting a first input inductor and a second input inductor in series with a current input source, wherein a first superconducting quantum interference device (SQUID) is inductively coupled to the first input inductor, a second SQUID is inductively coupled to the second input inductor, and a shunt inductor is connected parallel to the second input inductor;
  b) receiving an input current from the current input source;
  c) measuring a first voltage across the first SQUID using a first SQUID controller, wherein the first SQUID controller is connected to the first SQUID and a first feedback inductor, wherein the first feedback inductor is inductively coupled to the first SQUID;
  d) controlling, by the first SQUID controller, the current in the first feedback inductor based on the first voltage measured across the first SQUID;
  e) measuring a second voltage across the second SQUID using a second SQUID controller, wherein the second SQUID controller is connected to the second SQUID and a second feedback inductor, wherein the second feedback inductor is inductively coupled to the second SQUID;
  f) controlling, by the second SQUID controller, the current in the second feedback inductor based on the second voltage measured across the second SQUID;
  g) receiving a first output from the first SQUID controller and a second output the second SQUID controller at a processor, wherein the processor is connected to the first SQUID controller and the second SQUID controller; and h) comparing, by the processor, the first output and the second output to detect unlocking events in the first output of the first SQUID controller.

12. The method of claim 11 further comprising detecting the unlocking events by the processor using any one of scaling and subtracting, wavelet analysis and regression analysis.

13. The method of claim 11 further comprising removing, by the processor, the detected unlocking events from the first output of the first SQUID controller.

14. The method of claim 11 wherein the inductance of the shunt inductor is less than the inductance of the second input inductor.

15. The method of claim 14 wherein the inductance of the shunt inductor is 10% or less of the inductance of the second input inductor.

16. The method of claim 15 wherein the inductance of the shunt inductor is approximately 1% of the inductance of the second input inductor.

17. The method of claim 11 wherein the inductance of the first input inductor is substantially equal to the inductance of the second input inductor.

18. The method of claim 11 wherein an additional shunt inductor is connected in parallel in to the first input inductor.

19. The method of claim 18 wherein the inductance of the additional shunt inductor is less than the inductance of the first input inductor and greater than the inductance of the shunt inductor.

20. The method of claim 19 wherein the inductance of the additional shunt inductor is approximately 10% of the inductance of the first input inductor.

* * * * *